(12) United States Patent
Yu et al.

(10) Patent No.: US 7,870,461 B2
(45) Date of Patent: Jan. 11, 2011

(54) APPARATUS TO GENERATE A DUAL TRANSPORT STREAM AND METHOD THEREOF

(75) Inventors: Jung-pil Yu, Suwon-si (KR); Hae-joo Jeong, Seoul (KR); Eui-Jun Park, Seoul (KR); Joon-soo Kim, Seoul (KR); Yong-sik Kwon, Seoul (KR); Jin-Hee Jeong, Anyang-si (KR); Yong-deok Chang, Suwon-si (KR); Kum-ran Ji, Seoul (KR); Jong-hun Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1184 days.

(21) Appl. No.: 11/504,027

(22) Filed: Aug. 15, 2006

(65) Prior Publication Data

US 2007/0091929 A1   Apr. 26, 2007

Related U.S. Application Data

(60) Provisional application No. 60/728,777, filed on Oct. 21, 2005, provisional application No. 60/734,295, filed on Nov. 8, 2005, provisional application No. 60/738,050, filed on Nov. 21, 2005, provisional application No. 60/739,448, filed on Nov. 25, 2005, provisional application No. 60/788,707, filed on Apr. 4, 2006.

(30) Foreign Application Priority Data

Jul. 20, 2006   (KR) ............... 10-2006-0068048

(51) Int. Cl.
  *H03M 13/00*   (2006.01)
(52) U.S. Cl. ............... 714/755; 714/792; 714/800

(58) Field of Classification Search ............... 714/755, 714/792, 48, 788, 800; 375/340, 219, 321
See application file for complete search history.

(56) References Cited

U.S. PATENT DOCUMENTS 7,020,828 B2 *   3/2006   Birru ............... 714/792

(Continued)

FOREIGN PATENT DOCUMENTS

CN   1543219   11/2004

(Continued)

OTHER PUBLICATIONS

Search Report issued International Application No. PCT/KR2006/004296 on Oct. 20, 2006.

(Continued)

*Primary Examiner*—Fritz Alphonse
(74) *Attorney, Agent, or Firm*—Sughrue Mion, PLLC

(57) ABSTRACT

An apparatus and method to generate a dual transport stream. The apparatus includes an eraser encoder to receive a turbo stream and to eraser-encode the turbo stream, a duplicator to provide a parity insertion region for the eraser-encoded turbo stream, and a multiplexer to receive a normal stream and to multiplex the turbo stream processed by the duplicator and the normal stream to generate the dual transport stream. The duplicator provides the parity insertion region using a ½-rate conversion method or ¼-rate conversion method. Only the turbo stream is detected prior to the transmission of the dual transport stream, and the parity is inserted into the parity insertion region, so that the turbo stream can be robustly processed.

22 Claims, 4 Drawing Sheets

U.S. PATENT DOCUMENTS

| | | | |
|---|---|---|---|
| 7,194,047 B2 * | 3/2007 | Strolle et al. | 375/341 |
| 2002/0172277 A1 | 11/2002 | Choi et al. | |
| 2002/0194570 A1 | 12/2002 | Birru et al. | |

FOREIGN PATENT DOCUMENTS

| | | |
|---|---|---|
| WO | WO 02/100026 A1 | 12/2002 |
| WO | WO 03/003747 A1 | 1/2003 |

OTHER PUBLICATIONS

Written Opinion issued International Application No. PCT/KR2006/004296 on Oct. 20, 2006.

U.S. Appl. No. 11/416,254, filed May 3, 2006, Jung-pil Yu et al., Samsung Electronics Co., Ltd.

U.S. Appl. No. 11/416,258, filed May 3, 2006, Young-sik Kwon et al., Samsung Electronics Co., Ltd.

U.S. Appl. No. 11/416,457, filed May 3, 2006, Jung-pil Yu et al., Samsung Electronics Co., Ltd.

U.S. Appl. No. 11/503,970, filed Aug. 15, 2006, Jung-pil Yu et al., Samsung Electronics Co., Ltd.

U.S. Appl. No. 11/504,024, filed Aug. 15, 2006, Jung-pil Yu et al., Samsung Electronics Co., Ltd.

U.S. Appl. No. 11/504,029, filed Aug. 15, 2006, Jung-pil Yu et al., Samsung Electronics Co., Ltd.

U.S. Appl. No. 11/504,030, filed Aug. 15, 2006, Jung-pil Yu et al., Samsung Electronics Co., Ltd.

U.S. Appl. No. 11/504,031, filed Aug. 15, 2006, Jung-pil Yu et al., Samsung Electronics Co., Ltd.

U.S. Appl. No. 11/504,038, filed Aug. 15, 2006, Jung-pil Yu et al., Samsung Electronics Co., Ltd.

U.S. Appl. No. 11/504,651, filed Aug. 16, 2006, Jung-pil Yu et al., Samsung Electronics Co., Ltd.

U.S. Appl. No. 11/504,724, filed Aug. 16, 2006, Jung-pil Yu et al., Samsung Electronics Co., Ltd.

U.S. Appl. No. 11/504,725, filed Aug. 16, 2006, Jung-pil Yu et al., Samsung Electronics Co., Ltd.

U.S. Appl. No. 11/504,726, filed Aug. 16, 2006, Jung-pil Yu et al., Samsung Electronics Co., Ltd.

U.S. Appl. No. 11/505,369, filed Aug. 17, 2006, Jung-pil Yu et al., Samsung Electronics Co., Ltd.

U.S. Appl. No. 11/505,894, filed Aug. 18, 2006, Eui-jun Park et al., Samsung Electronics Co., Ltd.

U.S. Appl. No. 11/508,144, filed Aug. 23, 2006, Jung-pil Yu et al., Samsung Electronics Co., Ltd.

U.S. Appl. No. 11/523,716, filed Sep. 20, 2006, Jung-pil Yu et al., Samsung Electronics Co., Ltd.

U.S. Appl. No. 11/692,509, filed Mar. 28, 2007, Hae-joo Jeong et al., Samsung Electronics Co., Ltd.

Office Action issued in corresponding Chinese Patent Application No. 200680037125.5 dated Apr. 10, 2009.

* cited by examiner

| SYNC | PID | Turbo Data |
|------|-----|------------|
| SYNC | PID | Normal Data |
| SYNC | PID | Normal Data |
| SYNC | PID | Normal Data |

1     3           184

APPARATUS TO GENERATE A DUAL TRANSPORT STREAM AND METHOD THEREOF

CROSS-REFERENCE TO RELATED APPLICATIONS

This application claims the benefit of U.S. Provisional Application No. 60/728,777 filed Oct. 21, 2005, U.S. Provisional Application No. 60/734,295 filed Nov. 8, 2005, U.S. Provisional Application No. 60/738,050 filed Nov. 21, 2005, U.S. Provisional Application No. 60/739,448 filed Nov. 25, 2005, U.S. Provisional Application No. 60/788,707 filed Apr. 4, 2006, in the U.S. Patent and Trademark Office; and Korean Application No. 2006-68048, filed Jul. 20, 2006, in the Korean Intellectual Property Office, the disclosures of which are incorporated herein by reference.

BACKGROUND OF THE INVENTION

1. Field of the Invention

Aspects of the present invention relate to an apparatus to generate a dual transport stream including a normal stream and a turbo stream and a method thereof, and more particularly, to an apparatus to generate a dual transport stream including a normal stream and a turbo stream and a method thereof, which can improve digital broadcasting performance by generating the dual transport stream including the normal stream and the turbo stream robustly processed in order to improve receiving performance of an Advanced Television Systems Committee (ATSC) Vestigial Side Band (VSB) system that is an American-type digital terrestrial broadcasting system.

2. Description of the Related Art

An ATSC VSB system that is an American-type digital terrestrial broadcasting system is a signal carrier type broadcasting system, and uses a field sync signal in the unit of 312 segments. Accordingly, its receiving performance is not good in an inferior channel, and particularly, in a Doppler fading channel.

FIG. 1 is a block diagram illustrating the construction of a transmitter/receiver of an ATSC digital television (DTV) standard as a general American-type digital terrestrial broadcasting system. The digital broadcast transmitter of FIG. 1 is an enhanced VSB (EVSB) system proposed by Philips, which forms and transmits a dual stream provided by adding robust data to normal data of the basic ATSC VSB system.

As illustrated in FIG. 1, the digital broadcast transmitter includes a randomizer 11 to randomize a dual stream, an RS (Reed-Solomon) encoder 12 in the form of a concatenated encoder that adds parity bytes to the transport stream in order to correct errors occurring due to the channel characteristics in a transport process, an interleaver 13 to interleave the RS-encoded data according to a specified pattern, and a ⅔-rate trellis encoder 14 to map the interleaved data onto 8-level symbols by performing a ⅔-rate trellis encoding of the interleaved data. The digital broadcast transmitter performs an error correction coding of the dual stream.

The digital broadcast transmitter further includes a multiplexer 15 to insert a field sync signal and a segment sync signal into the error-correction-coded data as a data format, as illustrated in FIG. 2, and a modulator 16 to insert a pilot tone into the data symbols into which the segment sync signal and the field sync signal have been inserted by adding specified DC values to the data symbols, to perform a VSB modulation of the data symbols by pulse-shaping the data symbols, and to up-convert the modulated data symbols into an RF channel band signal to transmit the RF channel band signal.

In the digital broadcast transmitter, the normal data and the robust data are multiplexed (not illustrated) according to a dual stream system that transmits the normal data and the robust data through one channel, and the multiplexed data is inputted to the randomizer 11. The input data is randomized through the randomizer 11, outer-coded through the RS encoder 12 that is an outer encoder, and then distributed through the interleaver 13. Also, the interleaved data is inner-coded in the unit of 12 symbols through the trellis encoder 14, and then mapped onto the 8-level symbols. After the field sync signal and the segment sync signal are inserted into the coded data, the data is VSB-modulated by inserting a pilot tone into the data, and the VSB modulated data is converted into an RF signal.

On the other hand, the digital broadcast receiver of FIG. 1 includes a tuner (not illustrated) to convert an RF signal received through a channel into a baseband signal, a demodulator 21 to perform a sync detection and demodulation of the converted baseband signal, an equalizer 22 to compensate for a channel distortion of the demodulated signal occurring due to a multi-path, a Viterbi decoder 23 to correct errors of the equalized signal and to decode the error-corrected signal to symbol data, a deinterleaver 24 to rearrange the data distributed by the interleaver 13 of the digital broadcast transmitter, an RS decoder 25 to correct errors, and a derandomizer 26 to derandomize the data corrected through the RS decoder 25 and to output an MPEG-2 transport stream.

Accordingly, the digital broadcast receiver of FIG. 1 down-converts the RF signal into the baseband signal, demodulates and equalizes the converted signal, and then channel-decodes the demodulated signal to restore the original signal.

FIG. 2 illustrates a VSB data frame for use in the American type digital broadcasting (8-VSB) system, into which a segment sync signal and a field sync signal are inserted. As shown in FIG. 2, one frame is composed of two fields, and each field is composed of one field sync segment, which is the first segment, and 312 data segments. Also, one segment in the VSB data frame corresponds to one MPEG-2 packet, and is composed of a segment sync signal of four symbols and 828 data symbols.

In FIG. 2, the segment sync signal and the field sync signal are used for the synchronization and equalization in the digital broadcast receiver. That is, the field sync signal and the segment sync signal refer to known data between the digital broadcast transmitter and receiver, which is used as a reference signal when the equalization is performed on the receiver side.

The American type digital terrestrial broadcasting system as illustrated in FIG. 1 is a system that can form and transmit a dual stream produced by adding the robust data to the normal data of the existing ATSC VSB system. This system transmits the robust data together with the existing normal data.

However, the American type digital terrestrial broadcasting system of FIG. 1 has the problem in that there is almost no effect of improving the inferior receiving performance in a multipath channel due to the transmission of the existing normal data, even though the system transmits the dual stream produced by adding the robust data to the normal data.

That is, there is almost no effect of improving the receiving performance according to the improvement of the normal stream. Also, even with respect to a turbo stream, it does not have a significant effect of improving the receiving performance in a multipath environment. Accordingly, there is a need to generate a dual transport stream having a form in which a turbo stream can be robustly processed.

SUMMARY OF THE INVENTION

Aspects of the present invention have been developed in order to solve the above drawbacks and/or other problems associated with the conventional arrangement. An aspect of the present invention is to provide an apparatus to generate a dual transport stream including a normal stream and a turbo stream and a method thereof, which generates the dual transport stream including the normal stream and the turbo stream in order to improve the receiving performance of an Advanced Television Systems Committee (ATSC) Vestigial Side Band (VSB) system that is an American-type digital terrestrial broadcasting system, and which makes it possible to process the turbo stream more robustly by providing a region for inserting a parity after removing noise from the turbo stream.

The foregoing and/or other objects and advantages are substantially realized by providing an apparatus to generate a dual transport stream, according to aspects of the present invention, which includes an eraser encoder to receive a turbo stream and eraser-encode the turbo stream, a duplicator to provide a parity insertion region for the eraser-encoded turbo stream, and a multiplexer to receive a normal stream and to multiplex the turbo stream processed by the duplicator and the normal stream to generate the dual transport stream.

While not required in all aspects, the apparatus may further include an RS-encoder to perform an RS-encoding of the turbo stream to output the RS-encoded turbo stream to the duplicator. While not required in all aspects, the apparatus may further include an interleaver to inverleave the turbo stream. The duplicator may convert each byte constituting the turbo stream according to a ½-rate conversion method to generate two bytes. In this instance, the duplicator may divide each byte constituting the turbo stream into four bits to form two bit groups, and arrange in order a null bit for each bit of the respective bit groups to generate the two bytes.

The duplicator may convert each byte constituting the turbo stream according to a ¼-rate conversion method to generate four bytes. In this instance, the duplicator may divide each byte constituting the turbo stream into two bits to form four bit groups, and arrange in order three null bits for each bit of the respective bit groups to generate the four bytes.

While not required in all aspects, the RS encoder may add a parity of 20 bytes to a turbo stream of 184 bytes. Also, the dual transport stream may include a field composed of a plurality of successive packets, and the turbo stream may be arranged in the packet positioned at predetermined intervals in the field.

In another aspect of the present invention, there is provided a method of generating a dual transport stream, which includes (a) receiving a turbo stream and eraser-encoding the turbo stream, (b) providing a parity insertion region for the eraser-encoded turbo stream, and (c) receiving a normal stream and multiplexing the turbo stream provided with the parity insertion region and the normal stream to generate the dual transport stream.

While not required in all aspects, the method may further include performing RS-encoding of the received turbo stream.

While not required in all aspects, the method may further include interleaving the turbo stream. The operation (a) of receiving a turbo stream & eraser encoding the turbo stream may convert each byte constituting the turbo stream according to a ½-rate conversion method to generate two bytes. This operation (a) of receiving and eraser-encoding may divide each byte constituting the turbo stream into four bits to form two bit groups, and arrange in order one null bit for each bit of the respective bit groups to generate the two bytes.

While not required in all aspects, the operation (a) may convert each byte constituting the turbo stream according to a ¼-rate conversion method to generate four bytes. The operation (a) may divide each byte constituting the turbo stream into two bits to form four bit groups, and arrange in order three null bits for each bit of the respective bit groups to generate the four bytes.

While not required in all aspects, the RS encoding may add a parity of 20 bytes to a turbo stream of 184 bytes. While not required in all aspects, the dual transport stream may include a field composed of a plurality of packets, and the turbo stream may be arranged in the packet positioned at predetermined intervals in the field.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 2 is a view illustrating the structure of an ATSC VSB data frame;

DETAILED DESCRIPTION OF THE EMBODIMENTS

Figure 1:
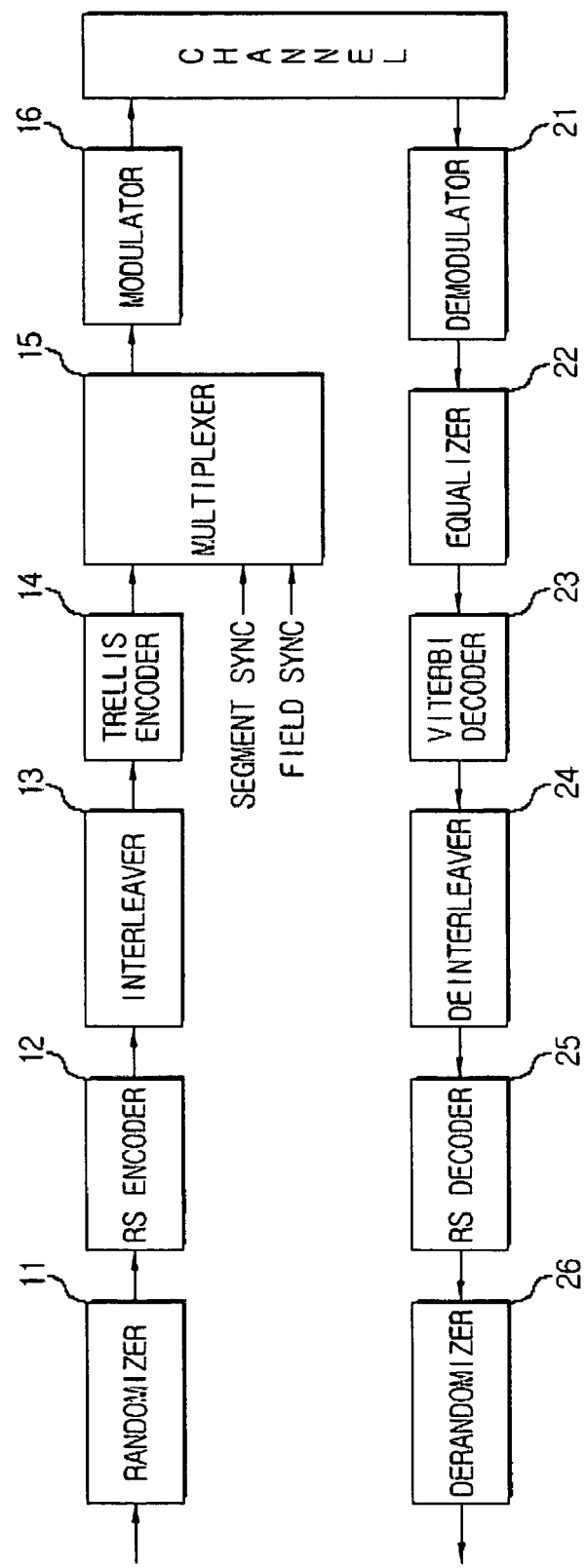
FIG. 1 is a block diagram illustrating the construction of a transmitting/receiving system of a general American-type digital broadcasting Advanced Televisions Systems Committee (ATSC) Vestigial Side Band (VSB) system.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
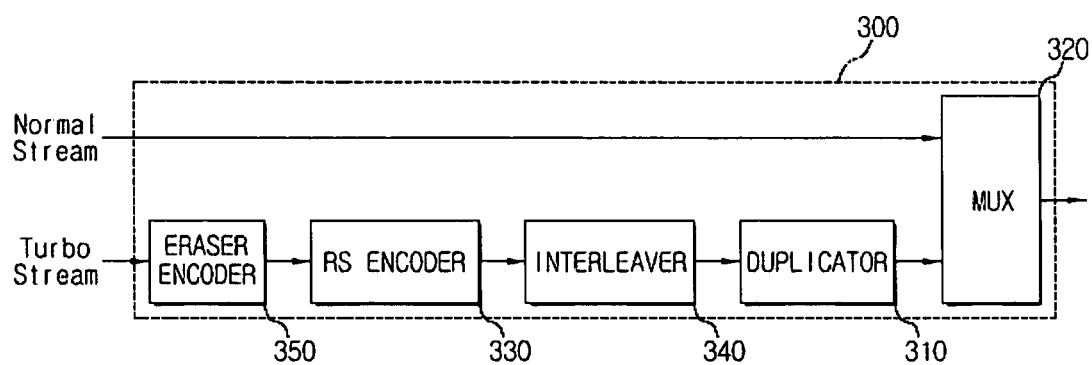
FIG. 3 is a block diagram illustrating the construction of an apparatus to generate a dual transport stream according to an embodiment of the present invention.

FIG. 3 is a block diagram illustrating the construction of an apparatus 300 to generate a dual transport stream according to an embodiment of the present invention. Referring to FIG. 3, the apparatus 300 to generate the dual transport stream includes a duplicator 310, a multiplexer 320, an eraser encoder 350, a Reed-Solomon (RS) encoder 330, and an interleaver 340.

The eraser encoder 350 performs eraser encoding by receiving a turbo stream from an exterior source and eliminating noise from the turbo stream. The turbo stream can be received from an external module, such as a broadcast photographing device, or diverse internal module, such as a compression processing module (e.g., MPEG-2 module), a video encoder, an audio encoder, or others. A receiving performance can be further improved by eliminating the noise from the turbo stream through the eraser encoder 350. The RS encoder 330 performs encoding of the eraser-encoded turbo stream. The interleaver 340 interleaves the encoded turbo stream according to a predetermined interleaving rule. That is, it serves to mix each byte in the turbo stream according to a specified rule.

The duplicator 310 serves to provide a parity insertion region for the interleaved turbo stream. Explaining a method of providing the parity insertion region in detail, each byte which is a constituent unit of the turbo stream is divided into 2 or 4 bytes. The divided byte is filled with a part of the bit values of the one byte and null data (e.g., 0). The region filled with the null data becomes the parity insertion region.

The operation of the duplicator 310 will now be described in detail. In the case of duplicating an input, supposing the bits constituting one byte are expressed as a, b, c, d, e, f, g, h, starting from most significant bit (MSB), and are inputted in order, the output of the duplicator 310 may be expressed as a, a, b, b, c, c, d, d, e, e, f, f, g, g, h, h. In this instance, it will be understood that two bytes, i.e., 1 byte composed of a, a, b, b, c, c, d, d and 1 byte composed of e, e, f, f, g, g, h, h, starting from MSB, are successively output.

In the case of quadruplicating the input, the output of the duplicator 310 may be expressed as a, a, a, a, b, b, b, b, c, c, c, c, d, d, d, d, e, e, e, e, f, f, f, f, g, g, g, g, h, h, h, h. As such, four bytes are output. Meanwhile, the duplicator 310 can put another certain value, i.e., null data, in a position other than the designated position, without duplicating the input bit. For example, if the duplicator doubles the input, only the front part of two successive bits (e.g., a, x, b, x, c, x, . . . ) may be maintained as the original input, and a certain value may be inserted into the rear part. By contrast, only the rear part may be maintained as the original input. In the case of quadruplicating the input, also, the original input may be positioned in any one of the first, second, third, and fourth positions, and certain values may be inserted into other parts.

The multiplexer 320 mixes the normal stream to be additionally received with the turbo stream processed by the duplicator 310. The normal stream may be received from various similar kinds of internal and external modules, as the turbo stream. Thus, the dual transport stream mixed with the normal stream and the turbo stream may be generated.

The generated dual transport stream is transmitted to a receiving device through randomization, encoding, robust processing, sync-signal multiplexing, modulation, and other processes. In the robust processing, for example, only the turbo stream is detected from the dual transport stream, and the parity for the turbo stream is inserted into the parity insertion region provided in the detected turbo stream, i.e., the parity insertion region provided by the duplicator 310, to make the turbo stream into a robust data stream.

The apparatus and processes to transmit the generated dual transport stream may be implemented by diverse manners as known by one of skill in the art, and the detailed description thereof will be omitted herein.

Figure 4:
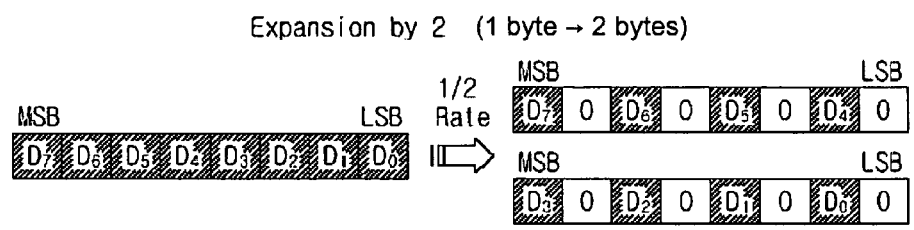
FIGS. 4 and 5 are views explaining various examples of a process of generating a parity insertion region in the apparatus to generate the dual transport stream in FIG. 3.
Figure 5:
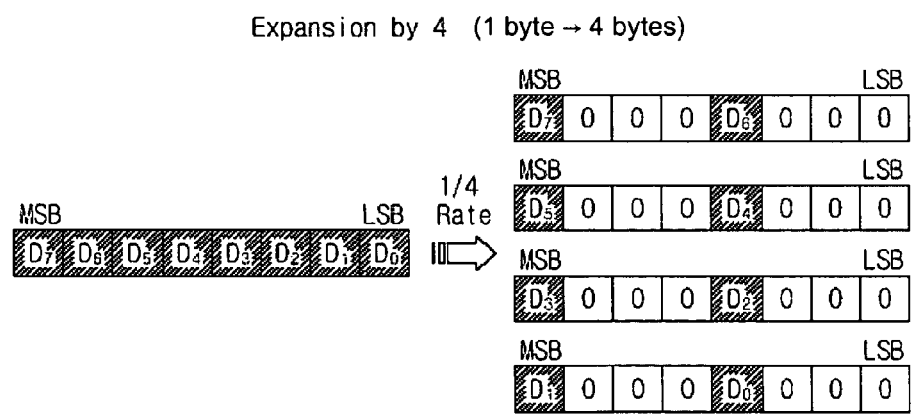

FIGS. 4 and 5 are views explaining various examples of the process in which the duplicator 310 generates the parity insertion region. First, FIG. 4 shows a ½-rate conversion method. The duplicator 310 generates two bytes by applying the ½-rate conversion method to each byte of the turbo stream. Referring to FIG. 4, one byte including bits of D0 through D7 is divided into two groups of four bits each to form two bit groups D0 through D3 and D4 through D7. In this state, one null bit is arranged in order for each bit of the respective bit groups to expand each bit group into a byte. As a result, the first byte including the bits D4 through D7 (D7 0 D6 0 D5 0 D4 0) and the second byte including the bits D0 through D3 (D3 0 D2 0 D10 D0 0) are generated. The bit between the respective bits of the first and second bytes is used as the parity insertion region. In other words, in the case of the first and second bytes, the 2nd, 4th, 6th, and 8th bits are used as the parity insertion region. The arranging position of the parity insertion region may be altered in various embodiments. For example, the 2nd, 3rd, 6th, and 7th bits or the 3rd, 4th, 5th, and 6th bits may be used as the parity insertion region.

FIG. 5 shows a ¼-rate conversion method. The duplicator 310 generates four bytes by applying the ¼-rate conversion method to each byte of the turbo stream. Referring to FIG. 5, one byte including D0 through D7 bits is divided into four groups of two bits each to form four bit groups D0-D1, D2-D3, D4-D5, and D6-D7. In this state, three null bits are arranged in order for each bit of the respective bit groups to expand each bit group into a byte. More specifically, the bit groups are expanded into the first byte (D7 0 0 0 D6 0 0 0), the second byte (D5 0 0 0 D4 0 0 0), the third byte (D3 0 0 0 D2 0 0 0), and the fourth byte (D10 0 0 D0 0 0 0). Referring to FIG. 5, the 2nd, 3rd, 4th, 6th, 7th, and 8th bits are used as the parity insertion region in the respective bytes.

Figures 6, 7:
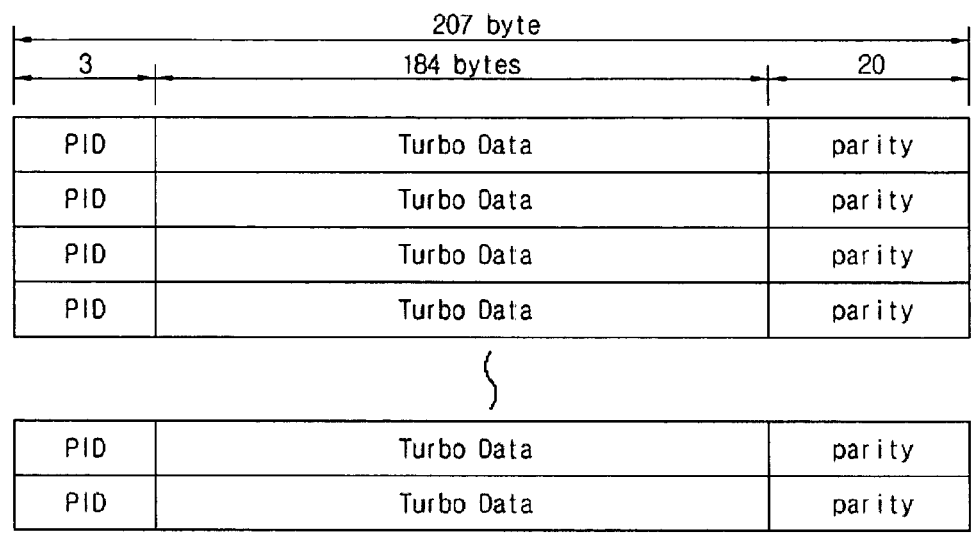
FIG. 6 is a view illustrating the structure of an RS-encoded packet in the apparatus to generate the dual transport stream in FIG. 3.
FIG. 7 is a view illustrating one example of a dual transport stream generated in the apparatus to generate a dual transport stream in FIG. 3.

FIG. 6 is a view illustrating one example of the structure of the packet RS-encoded by the RS encoder 330 in FIG. 3. The RS-encoder 330 in FIG. 3 receives a sync signal, a packet identity (PID), and the turbo stream composed of a turbo data region from the eraser encoder 350. The whole turbo stream packet may be composed of 188 bytes, in which the sync signal is 1 byte, the PID is 3 bytes, and the turbo data is 184 bytes. The RS encoder 330 eliminates the sync signal from the turbo stream, computes the parity for the turbo data region, and inserts the parity having a size of 20 bytes. As a result, one packet of finally encoded turbo stream is composed of a total of 207 bytes, in which 3 bytes are allocated to the PID, 184 bytes are allocated to the turbo data, and 20 bytes are allocated to the parity.

Meanwhile, in the apparatus 300 to generate the dual transport stream in FIG. 3, at least one of the RS encoder 330 and the interleaver 340 may be omitted. Also, the interleaver 340 may be positioned at the front end of the RS encoder 330, as opposed to where it is shown in FIG. 3.

FIG. 7 is a view illustrating one example of the dual transport stream generated in the apparatus to generate the dual transport stream. Referring to FIG. 7, the dual transport stream is composed of a plurality of successive packets. One packet may be composed of 188 bytes. More specifically, one packet may include 1 byte of sync signal, 3 bytes of PID, and 184 bytes of data region. As shown in FIG. 7, the robust data, i.e., turbo stream, is positioned in a specified packet of the dual transport stream. More specifically, FIG. 7 shows the state in which 78 packets of the turbo stream are inserted into 312 packets of one field of the dual transport stream. In this instance, the dual transport stream is composed of 4 successive packets of the turbo stream and the normal stream packets in the ratio of 1:3. That is, one packet (188 bytes) of the turbo stream and three packets (188 bytes) of the normal stream are successively arranged. Meanwhile, the structure of the dual transport stream may be modified depending upon diverse embodiments of the present invention.

The method of generating the dual transport stream according to the present invention may be described with reference to FIG. 3, and a flowchart thereof will be omitted herein. That is, the normal stream and the turbo stream are separately received, and only the turbo stream is eraser-encoded. And then, after the parity insertion region is provided in the turbo stream, the turbo stream and the normal stream are multiplexed to generate the dual transport stream. In this instance, the turbo stream may be encoded and the encoded turbo stream may be interleaved prior to the providing of the parity insertion region. The method of providing the parity insertion region was explained previously with reference to FIGS. 4 and 5, and the structure of the encoded turbo stream was explained with reference to FIG. 6. Therefore, additional description thereof will be omitted herein.

Aspects of the invention and/or blocks of the invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical disks, and optical data storage devices. Also, aspects of the invention may be embodied in computer-readable code embodied as a computer data signal in a carrier wave.

As described above, the apparatus to generate the dual transport stream according to the present invention can generate the dual transport stream including the normal stream and the turbo stream in order to improve the receiving performance of the Advanced Television Systems Committee (ATSC) Vestigial Side Band (VSB) system that is the American-type digital terrestrial broadcasting system. In this instance, the turbo stream can be more robustly processed by eliminating the noise from the turbo stream and providing the parity insertion region. Also, the apparatus to generate the dual transport stream can be compatible with the existing normal data transmitting system, and thus can improve the receiving performance in diverse receiving environments, with a simple construction.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An apparatus to generate a dual transport stream, comprising:
   an eraser encoder to receive a turbo stream and to eraser-encode the turbo stream;
   a duplicator to provide a parity insertion region for the eraser-encoded turbo stream; and
   a multiplexer to receive a normal stream and to multiplex the turbo stream processed by the duplicator and the normal stream to generate the dual transport stream.

2. The apparatus as claimed in claim 1, further comprising a Reed Solomon (RS) encoder to RS-encode the turbo stream and to output the RS-encoded turbo stream to the duplicator.

3. The apparatus as claimed in claim 2, further comprising an interleaver to interleave the turbo stream.

4. The apparatus as claimed in claim 2, wherein the RS encoder adds a parity of 20 bytes to a turbo stream of 184 bytes.

5. The apparatus as claimed in claim 1, wherein the duplicator converts each byte constituting the turbo stream according to a ½-rate conversion method to generate two bytes.

6. The apparatus as claimed in claim 5, wherein the duplicator divides each byte constituting the turbo stream by four bits to form two bit groups, and arranges in order a null bit for each bit of the respective bit groups to generate the two bytes.

7. The apparatus as claimed in claim 1, wherein the duplicator converts each byte constituting the turbo stream according to a ¼-rate conversion method to generate four bytes.

8. The apparatus as claimed in claim 7, wherein the duplicator divides each byte constituting the turbo stream by two bits to form four bit groups, and arranges in order three null bits for each bit of the respective bit groups to generate the four bytes.

9. The apparatus as claimed in claim 1, wherein the dual transport stream includes a field composed of a plurality of successive packets, and the turbo stream is arranged in the packets positioned at predetermined intervals in the field.

10. The apparatus as claimed in claim 1, wherein the dual transport stream is broadcast on the Advanced Television Systems Committee (ATSC) Vestigial Side Band (VSB) system to improve receiving performance.

11. A method of generating a dual transport stream using an apparatus to generate the dual transport stream comprising an eraser encoder, a duplicator and a multiplexer, the method comprising:
   receiving, using the eraser encoder, a turbo stream and eraser-encoding the turbo stream;
   providing, using the duplicator, a parity insertion region for the eraser-encoded turbo stream; and
   receiving, using the multiplexer, a normal stream and multiplexing the turbo stream provided with the parity insertion region and the normal stream to generate the dual transport stream.

12. The method as claimed in claim 11, further comprising performing Reed Solomon (RS)-encoding of the received turbo stream.

13. The method as claimed in claim 12, further comprising interleaving the turbo stream.

14. The method as claimed in claim 12, wherein the RS encoding adds a parity of 20 bytes to a turbo stream of 184 bytes.

15. The method as claimed in claim 11, wherein the receiving of the turbo stream and eraser-encoding the turbo stream, comprises converting each byte constituting the turbo stream according to a ½-rate conversion method to generate two bytes.

16. The method as claimed in claim 15, wherein the receiving of the turbo stream and eraser-encoding the turbo stream, comprises dividing each byte constituting the turbo stream by four bits to form two bit groups, and arranges in order one null bit for each bit of the respective bit groups to generate the two bytes.

17. The method as claimed in claim 11, wherein the receiving of the turbo stream and eraser-encoding the turbo stream, comprises converting each byte constituting the turbo stream according to a ¼-rate conversion method to generate four bytes.

18. The method as claimed in claim 17, wherein the receiving and eraser-encoding the turbo stream, comprises dividing each byte constituting the turbo stream by two bits to form four bit groups, and arranges in order three null bits for each bit of the respective bit groups to generate the four bytes.

19. The method as claimed in claim 11, wherein the dual transport stream includes a field composed of a plurality of packets, and the turbo stream is arranged in the packets positioned at predetermined intervals in the field.

20. The method as claimed in claim 11, wherein the dual transport stream is broadcast on the Advanced Television Systems Committee (ATSC) Vestigial Side Band (VSB) system to improve receiving performance.

21. An apparatus to generate a robust turbo stream in a dual transport stream, comprising:

a duplicator to receive a turbo stream and to provide a parity insertion region for the turbo stream; and a multiplexer to receive a normal stream and to multiplex the turbo stream processed by the duplicator and the normal stream to generate the dual transport stream.

22. A method of generating a robust turbo stream in a dual transport stream using an apparatus to generate the robust turbo stream comprising a duplicator and a multiplexer, the method comprising:

receiving, using the duplicator, a turbo stream;

providing, using the duplicator, a parity insertion region for the turbo stream; and receiving, using the multiplexer, a normal stream and multiplexing the turbo stream provided with the parity insertion region and the normal stream to generate the dual transport stream.

* * * * *